United States Patent
Yang (10) Patent No.: US 9,508,613 B2
(45) Date of Patent: Nov. 29, 2016

(54) METHOD FOR TESTING SUSCEPTOR OF CHEMICAL VAPOR DEPOSITION APPARATUS AND METHOD FOR MANUFACTURING ORGANIC LIGHT EMITTING DISPLAY APPARATUS BY USING THE SAME

(71) Applicant: SAMSUNG DISPLAY CO., LTD., Yongin, Gyeonggi-Do (KR)

(72) Inventor: Jin-Woo Yang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/149,576

(22) Filed: Jan. 7, 2014

(65) Prior Publication Data

US 2015/0050757 A1   Feb. 19, 2015

(30) Foreign Application Priority Data

Aug. 19, 2013   (KR) ................. 10-2013-0098144

(51) Int. Cl.
| | |
|---|---|
| *G01R 31/26* | (2014.01) |
| *H01L 21/66* | (2006.01) |
| *C23C 16/458* | (2006.01) |
| *C23C 16/52* | (2006.01) |
| *H01L 51/00* | (2006.01) |
| *H01L 51/56* | (2006.01) |

(52) U.S. Cl.
CPC ............. *H01L 22/14* (2013.01); *C23C 16/458* (2013.01); *C23C 16/52* (2013.01); *H01L 51/001* (2013.01); *H01L 51/56* (2013.01)

(58) Field of Classification Search
CPC ............................ C23C 16/46; H01L 21/0262
USPC ...................... 438/14; 118/712, 715
See application file for complete search history.

(56) References Cited

U.S. PATENT DOCUMENTS

| | | | |
|---|---|---|---|
| 6,821,655 B1 | 11/2004 | Ohta et al. | |
| 7,279,066 B2 * | 10/2007 | Ohmi | ........................ 118/715 |
| 2002/0004262 A1 * | 1/2002 | Asami et al. | ............... 438/166 |
| 2008/0070385 A1 * | 3/2008 | Won | ...................... C23C 8/36 |
| | | | 438/482 |
| 2010/0189636 A1 | 7/2010 | Ikisawa et al. | |
| 2010/0285629 A1 * | 11/2010 | Suzuki | .......................... 438/57 |

(Continued)

FOREIGN PATENT DOCUMENTS

| | | |
|---|---|---|
| JP | 09-025575 | 1/1997 |
| JP | 2001-89846 | 4/2001 |
| KR | 10-2012-0108062 | 10/2012 |

OTHER PUBLICATIONS

Fallah, Hamid Reza, et al., Substrate temperature effect on transparent heat reflecting nanocrystalline ITO films prepared by electron beam evaporation, Science Direct, Renewable Energy xxx (2009) 1-4, Department of Physics, Islamic Azad University, Shahreza branch, Shahreza, Iran.

*Primary Examiner* — Julia Slutsker
(74) *Attorney, Agent, or Firm* — Lewis Roca Rothgerber Christie LLP (57) ABSTRACT

A method for testing a susceptor of a chemical vapor deposition (CVD) apparatus includes preparing a substrate including a transparent conductive layer, disposing the substrate with the transparent conductive layer on the susceptor of the CVD apparatus, and determining whether or not the susceptor of the CVD apparatus is normal by measuring a surface resistance across the transparent conductive layer.

14 Claims, 5 Drawing Sheets

(56) References Cited

U.S. PATENT DOCUMENTS

2012/0241198 A1* 9/2012 Kajiya et al. .................. 174/250
2013/0095292 A1* 4/2013 Pfaff .................... C03C 17/3417
                                                              428/142
2015/0125717 A1* 5/2015 Galazka .................. C30B 11/00
                                                              428/697

* cited by examiner

METHOD FOR TESTING SUSCEPTOR OF CHEMICAL VAPOR DEPOSITION APPARATUS AND METHOD FOR MANUFACTURING ORGANIC LIGHT EMITTING DISPLAY APPARATUS BY USING THE SAME

CROSS-REFERENCE TO RELATED APPLICATION

This application claims priority to and the benefit of Korean Patent Application No. 10-2013-0098144, filed on Aug. 19, 2013, in the Korean Intellectual Property Office, the disclosure of which is incorporated herein in its entirety by reference.

BACKGROUND

1. Field

One or more embodiments of the present invention relate to a method for testing a susceptor of a chemical vapor deposition apparatus and a method for manufacturing an organic light emitting display apparatus using the same, and more particularly, to a method for testing a susceptor of a chemical vapor deposition apparatus capable of determining whether or not the susceptor is normal without reducing a temperature in a chamber of the chemical vapor deposition apparatus, and a method for manufacturing an organic light emitting display apparatus using the method for testing the susceptor.

2. Description of the Related Art

Organic light emitting display apparatuses may include an intermediate layer having a multilayer structure including an emission layer between a pixel electrode and an opposite electrode facing the pixel electrode (e.g., opposite to the pixel electrode). When manufacturing organic light emitting display apparatuses as described above, a vapor deposition method may be used to form the intermediate layer. When manufacturing organic light emitting display apparatuses using the vapor deposition method, a chemical vapor deposition (CVD) apparatus may be used.

When using the CVD apparatus, a substrate, on which deposition will be performed, may be disposed on a susceptor of the CVD apparatus, a reactive gas may be supplied to a chamber and has a chemical reaction, and a reaction product may be deposited on the substrate, thereby forming a deposition film.

When using the CVD apparatus, a temperature (e.g., a preset temperature) of the susceptor, on which the substrate on which the deposition will be performed is disposed, should be maintained. Accordingly, the temperature of the susceptor in the CVD apparatus should periodically be checked or measured. However, typically, a temperature in the chamber of the CVD apparatus is reduced to a room temperature, the chamber is exhausted and then opened to insert quartz glass thereinto and is then closed, and the temperature of the chamber is increased to determine whether or not the temperature of the susceptor is normal (e.g., within a predetermined range).

However, in a comparable method of checking whether or not a susceptor is normal, for example as described above, an amount of time spent while reducing the temperature in the chamber of the CVD apparatus and then increasing the temperature may be more than, for example, 48 hours. Also, the susceptor may become polluted while opening the chamber and inserting quartz glass thereinto.

SUMMARY

Aspects of embodiments of the present invention are directed toward a method for testing a susceptor of a chemical vapor deposition (CVD) apparatus, capable of determining whether or not the susceptor is normal without reducing a temperature of a chamber of the CVD apparatus, and a method for manufacturing an organic light emitting display apparatus using the method for testing the susceptor.

Additional aspects and characteristics will be set forth in part in the description which follows and, in part, will be apparent from the description, or may be learned by practice of the presented example embodiments.

According to one or more embodiments of the present invention, a method for testing a susceptor of a chemical vapor deposition (CVD) apparatus includes preparing a substrate including a transparent conductive layer, disposing the substrate with the transparent conductive layer on the susceptor of the CVD apparatus, and determining whether or not the susceptor of the CVD apparatus is normal by measuring a surface resistance across the transparent conductive layer.

The method may further include determining whether or not the surface resistance across the transparent conductive layer formed on the substrate is normal.

The determining whether or not the susceptor is normal may include determining whether or not the susceptor is normal according to uniformity of the surface resistance across the transparent conductive layer.

The determining whether or not the susceptor is normal may also include determining that the susceptor is normal when the uniformity of the surface resistance across the transparent conductive layer is within a range.

The determining whether or not the susceptor is normal may also include determining that the susceptor is normal when the uniformity of the surface resistance across the transparent conductive layer is about 15% or less.

The determining whether or not the susceptor is normal may include determining whether or not the susceptor is normal by measuring the surface resistance across a plurality of locations on the transparent conductive layer.

The transparent conductive layer may include an amorphous transparent conductive layer.

The disposing the substrate formed with the transparent conductive layer may be performed while the CVD apparatus has a temperature and a vacuum level for performing deposition.

The transparent conductive layer may include at least one of indium tin oxide, zinc oxide, and aluminum zinc oxide.

According to one or more embodiments of the present invention, a method for manufacturing an organic light emitting display apparatus includes preparing a substrate including a transparent conductive layer, disposing the substrate with the transparent conductive layer on a susceptor of a chemical vapor deposition (CVD) apparatus, determining whether or not the susceptor of the CVD apparatus is normal by measuring a surface resistance across the transparent conductive layer, removing the substrate with the transparent conductive layer from the CVD apparatus, inserting an other substrate, on which deposition will be performed, into the CVD apparatus when the susceptor is determined to be normal, and forming a deposition film on the other substrate.

The method may further include determining whether or not the surface resistance across the transparent conductive layer formed on the substrate is normal.

The determining whether or not the susceptor is normal may also include determining whether or not the susceptor is normal according to uniformity of the surface resistance across the transparent conductive layer.

The determining whether or not the susceptor is normal may also include determining that the susceptor is normal when the uniformity of the surface resistance across the transparent conductive layer is within a range.

The determining whether or not the susceptor is normal may also include determining that the susceptor is normal when the uniformity of the surface resistance across the transparent conductive layer is about 15% or less.

The determining whether or not the susceptor is normal may include determining whether or not the susceptor is normal by measuring the surface resistance across a plurality of locations on the transparent conductive layer.

The transparent conductive layer may include an amorphous transparent conductive layer.

The disposing the substrate with the transparent conductive layer may be performed in the CVD apparatus having a temperature and a vacuum level for performing deposition.

The transparent conductive layer may include at least one of indium tin oxide, zinc oxide, and aluminum zinc oxide.

According to one or more embodiments of the present invention, a method for manufacturing an organic light emitting display apparatus includes preparing a substrate including a transparent conductive layer, disposing the substrate with the transparent conductive layer on a susceptor of a chemical vapor deposition (CVD) apparatus, removing the substrate with the transparent conductive layer from the CVD apparatus, determining whether or not the susceptor of the CVD apparatus is normal by measuring a surface resistance across the transparent conductive layer, inserting another substrate, on which deposition will be performed, into the CVD apparatus when the susceptor is determined to be normal, and forming a deposition film on the other substrate.

BRIEF DESCRIPTION OF THE DRAWINGS

These and/or other aspects and characteristics will become apparent and more readily appreciated from the following description of example embodiments, taken in conjunction with the accompanying drawings of which.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

Hereinafter, example embodiments of the present invention will be described in detail with reference to the attached drawings. However, because the present invention is not limited to embodiments disclosed below but may be embodied in various different shapes and forms, the embodiments below are provided to fully disclose the present invention and to allow a person with ordinary skill to understand the scope of the present invention. Also, for convenience of description, in the drawings, sizes of elements may be exaggerated or contracted. For example, a size of a thickness of each of the elements shown in the drawings is arbitrarily shown for convenience of description and is not limited thereto.

It will be understood that when a layer, region, or component is referred to as being "formed on" an other layer, region, or component, it can be directly or indirectly formed on the other layer, region, or component. That is, for example, intervening layers, regions, or components may be present therebetween.

Figure 1:
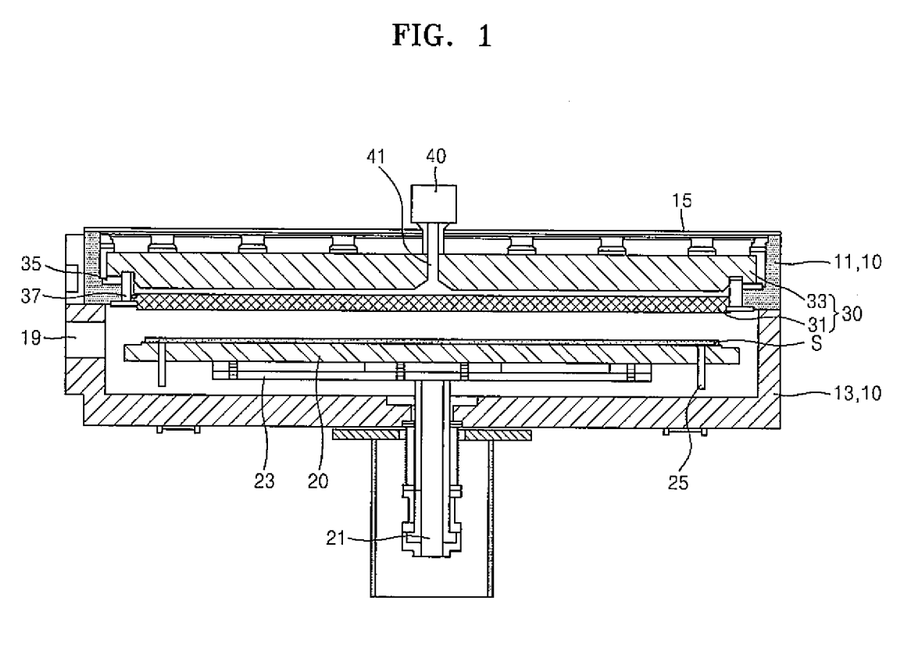
FIG. 1 is a cross-sectional view schematically illustrating a chemical vapor deposition (CVD) apparatus, to which a method for testing a susceptor according to an embodiment of the present invention may be applied.

FIG. 1 is a cross-sectional view schematically illustrating a chemical vapor deposition (CVD) apparatus, to which a method for testing a susceptor 20 according to an embodiment of the present invention may be applied. As shown in FIG. 1, the CVD apparatus includes a chamber 10, the susceptor 20 that includes a lower electrode located in the chamber 10, an upper electrode 30 located in the chamber 10, and a gas supply unit 40 for supplying gases (e.g., configured to supply gases) into the chamber 10.

The chamber 10 may include an upper chamber 11 and a lower chamber 13. The upper chamber 11 and the lower chamber 13 may be coupled with each other to define a space in which deposition will be performed. When the upper chamber 11 and the lower chamber 13 are coupled with each other, a space therein allowing the deposition to be performed may be shielded and kept in a vacuum atmosphere (e.g., in a vacuum state). The upper chamber 11 may be separated from the lower chamber 13 to allow the inside of the chamber 10 to be open for, for example, maintenance.

The lower chamber 13 may be formed with a path part 19 that is a path for allowing a substrate S, on which deposition will be performed, to be inserted thereinto or removed (e.g., discharged) therefrom by, for example, a transfer robot. The path part 19 may be opened and closed by a gate valve.

The susceptor 20 that includes the lower electrode may be located at a bottom of the chamber 10, and the substrate S, on which the deposition will be performed, may be supported by (e.g., on or above) the susceptor 20. The susceptor 20 may have a larger area (e.g., a larger surface area) than the substrate S that is a target of the deposition. A heater may be disposed in the susceptor 20 or below the susceptor 20 to heat (e.g., configured to heat) the susceptor 20 to a temperature of, for example, several hundred degrees Celsius to allow the deposition to be adequately performed and to allow the temperature of the susceptor 20 to be maintained.

The susceptor 20 may be elevated by (e.g., configured to be elevated by) an elevation unit 21 below the susceptor 20. For example, when the substrate S is inserted into the chamber 10 through the path part 19, the susceptor 20 descends to be located at a bottom of the lower chamber 13. As the susceptor 20 descends, substrate pins 25 ascend through penetration holes penetrating (e.g., extending through) the susceptor 20 and protrude (e.g., protrude upwardly) from a top surface of the susceptor 20 and the transfer robot disposes the substrate S on the substrate pins 25 and then retracts through the path part 19. After that, the susceptor 20 is lifted up by the elevation unit 21 to allow the substrate S to be located adjacent to (e.g., under) the upper electrode 30, thereby allowing the deposition to be performed on the substrate S. As the susceptor 20 is raised (e.g., lifted up), the substrate pins 25 descend (e.g., descend relative to the surface of the susceptor 20) in such a way that the substrate S is mounted on the susceptor 20.

To reduce or prevent droop of the susceptor 20 supporting the substrate S, a susceptor frame 23 coupled with the elevation unit 21 and supporting the susceptor 20 (e.g., configured to support the susceptor 20) may be provided.

The upper electrode 30 is disposed at or in the upper chamber 11. The upper electrode 30 allows the deposition to be performed on the substrate S through interaction between the upper electrode 30 and the susceptor 20.

The upper electrode 30 includes a gas diffuser 31 located above (e.g., toward or facing) the susceptor 20 and a backing plate 33 located opposite to (e.g., above) the susceptor 20 and centered with respect to the gas diffuser 31. A space may be present between the gas diffuser 31 and the backing plate 33. For this, a supporting element 37 may be disposed between the gas diffuser 31 and the backing plate 33.

The gas diffuser 31 is located above the susceptor 20, on which the substrate S on which the deposition will be performed is disposed, and includes a plurality of vent holes for supplying a reactive gas (e.g., configured to supply a reactive gas) toward a top surface of the substrate S. Accordingly, as described above, after the substrate S is on (e.g., mounted on) the susceptor 20 and then the susceptor 20 is lifted up by the elevation unit 21 to allow the substrate S to be disposed adjacent to (e.g., under) the gas diffuser 31, the reactive gas may be supplied to the top surface of the substrate S through the plurality of vent holes of the gas diffuser 31 to allow the deposition to be performed on the substrate S.

The backing plate 33 may be electrically connected to a radiofrequency power source unit. Because the chamber 10 may be electrified when the backing plate 33 is in contact with the chamber 10, an insulator 35 may be disposed between the backing plate 33 and the upper chamber 11 to prevent an electric current from transferring therebetween.

An upper plate 15 may be disposed at a top of the upper chamber 11, and the gas supply unit 40 capable of supplying a reactive gas or a cleaning gas (e.g., configured to supply a reactive gas or a cleaning gas) into the chamber 10 is disposed on or above the upper plate 15. Gases supplied by the gas supply unit 40 are transferred to (e.g., move to) a buffer space between the backing plate 33 and the gas diffuser 31 through a gas passage 41 formed in the backing plate 33 and are supplied from the buffer space between the backing plate 33 and the gas diffuser 31 to a space between the upper electrode 30 and the susceptor 20 that includes the lower electrode through the plurality of vent holes of the gas diffuser 31.

In addition to the example configuration as described above, other elements, for example a pump) for creating a vacuum (e.g., creating a vacuum state) in the chamber 10, may be present in the CVD apparatus.

In the CVD apparatus, the temperature of the susceptor 20 should be within a range (e.g., a preset range). Also, to allow a deposition film to be uniformly formed on the substrate S on the susceptor 20, a temperature deviation across the top surface of the susceptor 20 should be within a range (e.g., a preset range). Accordingly, the susceptor 20 should be periodically tested or measured (e.g., to periodically determine whether or not the susceptor 20 is normal).

Accordingly, to determine whether or not the susceptor 20 is normal (e.g., to determine whether or not the temperature of the susceptor 20 is within the range and/or the temperature gradient across the susceptor 20 is within the range), a substrate formed with a transparent conductive layer may be prepared. In one example, the transparent conductive layer may include one or more of indium tin oxide indium tin oxide (ITO), zinc oxide (ZnO), and/or aluminum zinc oxide (AZO). Additionally, the transparent conductive layer on the substrate may be an amorphous transparent conductive layer. For example, when a substrate formed with an ITO film is prepared, the ITO film may be an amorphous ITO film. After the substrate formed with the transparent conductive layer is prepared as described above, the substrate is disposed on the susceptor 20 of the CVD apparatus. Disposing the substrate formed with the transparent conductive layer on the susceptor 20 may be performed through the same or similar process of disposing a substrate on the susceptor 20 while performing vapor deposition using the CVD apparatus.

Once the substrate formed with the transparent conductive layer is disposed on the susceptor 20, it is allowed to remain on the susceptor 20 for a period of time, for example, 20 minutes. In this example, because the susceptor 20 is maintained at a temperature for performing general deposition by the heater, as a result thereof, the transparent conductive layer on the substrate is annealed during that time. After that (e.g., after the period of time), a surface resistance of the transparent conductive layer may be measured. Using obtained information related to surface resistance, it may be efficiently determined whether or not the susceptor 20 of the CVD apparatus is normal.

Figure 2:
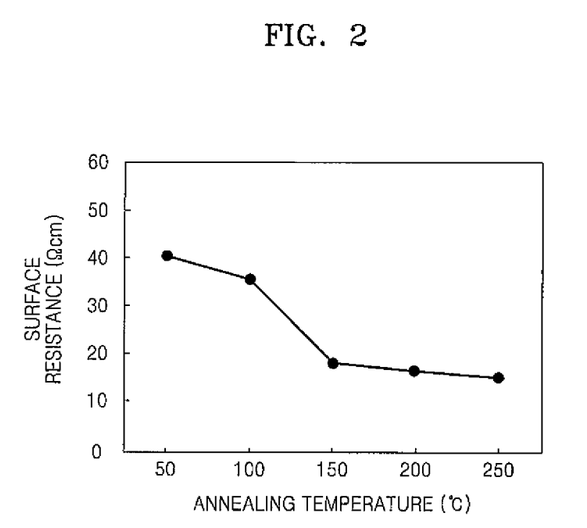
FIG. 2 is a graph schematically illustrating a surface resistance of an amorphous indium tin oxide (ITO) film according to an annealing temperature.

FIG. 2 is a graph schematically illustrating a surface resistance of an amorphous ITO film according to an annealing temperature. As shown in FIG. 2, the surface resistance of the ITO film after annealing varies according to the temperature of annealing the amorphous ITO film. For example, as the temperature of annealing the amorphous ITO film increases, the surface resistance of the amorphous ITO film may decrease. Accordingly, when measuring the surface resistance of the amorphous ITO film after the substrate formed with the amorphous ITO film is disposed on the susceptor 20 and a certain amount of time has passed, the temperature of the annealed amorphous ITO film may be determined according to the measured surface resistance of the amorphous ITO film and a surface temperature distribution across the susceptor 20 may also be determined. Accordingly, by measuring the surface resistance of the amorphous ITO film, it may be determined whether or not the susceptor 20 of the CVD apparatus is normal (e.g., whether or not the surface temperature and/or the surface temperature distribution is normal). Because a surface resistance of ITO after annealing varies according to the annealing temperature, an ITO film may be used as the transparent conductive layer. Because AZO and ZnO have similar properties as ITO, AZO or ZnO may also be used as the transparent conductive layer.

According to the method for testing the susceptor as described above, i.e., for determining whether or not the susceptor is normal as described above, whether or not the CVD apparatus is in a configuration for deposition may be efficiently determined.

Comparatively, whether or not the susceptor 20 is normal may be determined using a process in which a temperature in the chamber 10 is reduced to a room temperature, the upper chamber 11 is separated from the lower chamber 13, the upper electrode 30 is removed (e.g., extracted), a quartz substrate is disposed on the susceptor 20, the upper chamber 11 is coupled with the lower chamber 13, and the temperature in the chamber 10 is increased to (e.g., returned to), for example, several hundred degrees Celsius, that is, a deposition temperature. The process may consume about 48 hours considering time to reduce and increase the temperature and time to separate and combine the upper chamber 11 and the lower chamber 13.

However, according to the method for testing the susceptor of the CVD apparatus according to the present embodiment, a substrate formed with a transparent conductive layer may be inserted into the chamber 10 when the inside of the chamber 10 is maintained in a proper condition for deposition and a surface resistance of the transparent conductive layer may be measured, thereby easily and quickly determining whether or not the susceptor 20 is normal.

Generally, a substantially uniform temperature of the top surface of the susceptor 20 on which the substrate S is on (e.g., mounted on) should be maintained to form a deposition film on the substrate S having a uniform thickness. Accordingly, based upon uniformity of a surface resistance of the transparent conductive layer, it may be determined whether or not the susceptor 20 is normal. When the surface resistance of the transparent conductive layer after an annealing process is substantially uniform, distribution of a temperature across the top surface of the susceptor 20 may be determined to be substantially uniform.

That is, when the surface resistance of the transparent conductive layer is substantially uniform and within a range (e.g., a preset range), the susceptor 20 may be determined to be normal. For example, the range (e.g., the preset range) may be about 0% to about 15% deviation. As a result of repetitive experiments, it was determined that a thin film having a substantially uniform thickness was formed when the substrate S was disposed on the susceptor 20 in a condition in which the deviation of the surface resistance of the transparent conductive layer was about 15% or less and deposition was allowed to be performed. When the substrate S was disposed on the susceptor 20 and deposition was performed when the deviation of the surface resistance of the transparent conductive layer was greater than 15%, a thickness of a formed deposition film was determined to not be substantially uniform.

Figure 3:
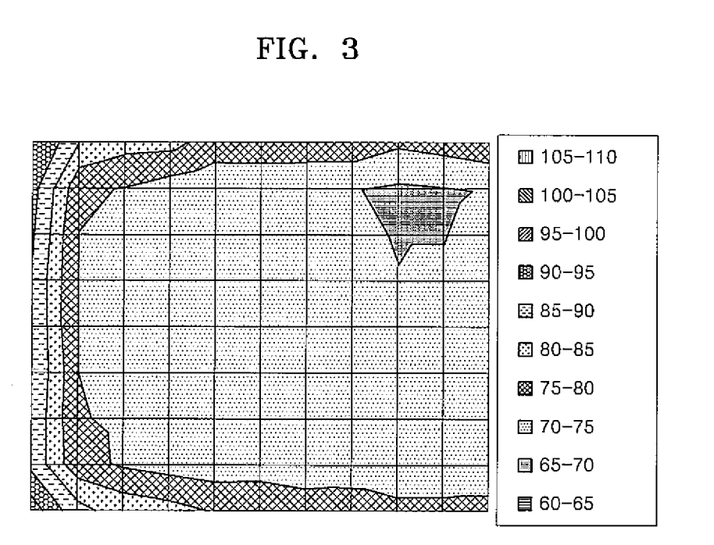
FIGS. 3 and 4 are schematic views illustrating results from the method for testing the susceptor, from which it may be determined that the susceptor is not normal.
Figure 4:
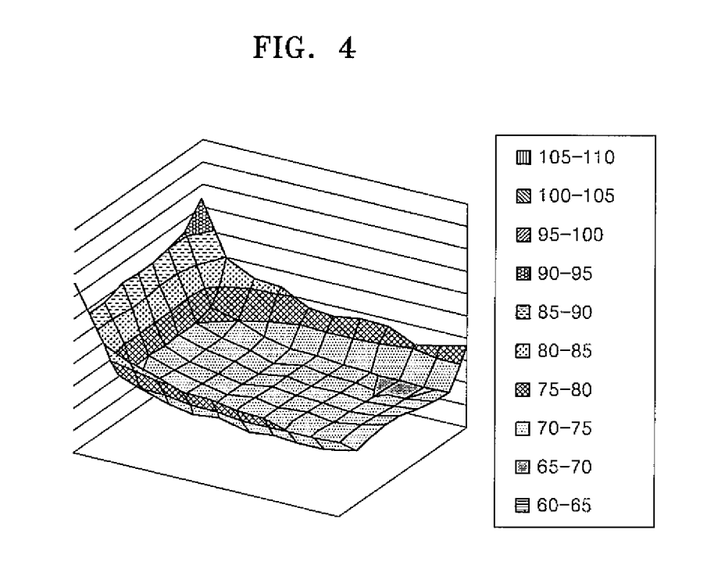

FIGS. 3 and 4 are schematic views illustrating results from the method of checking whether or not the susceptor is normal, from which it may be determined that the susceptor is not normal. FIG. 3 illustrates a result of measuring a surface resistance of an ITO film in which the substrate S formed with an ITO film is disposed on (e.g., mounted on) the susceptor 20 and then about 20 minutes passes (unit: Ωcm). It may be realized that the surface resistance is illustrated according to a position on a surface of the ITO film. FIG. 4 three-dimensionally illustrates the surface resistance according to the position on the surface of the ITO film, in which the surface resistance is relatively low at a central portion of the ITO film and is relatively high at an edge thereof, thereby illustrating that a difference therebetween is relatively large (unit: Ωcm). This means that a temperature of the susceptor 20 is relatively high at the central portion and is relatively low at the edge of the susceptor 20 and the relative difference in temperature is large. Actually, FIGS. 3 and 4 illustrate a case in which the deviation of the surface resistance of the ITO layer is 17.5% and the susceptor 20 is defective or not normal.

Figure 5:
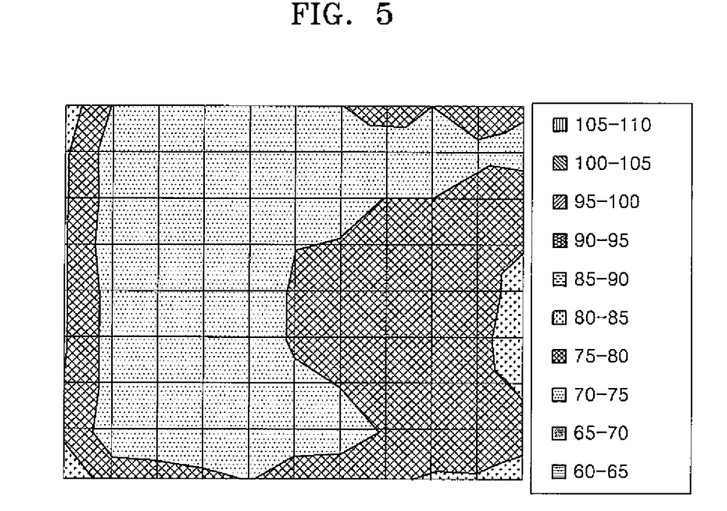
FIGS. 5 and 6 are schematic views illustrating results from the method for testing the susceptor, from which it may be determined that the susceptor is normal.
Figure 6:
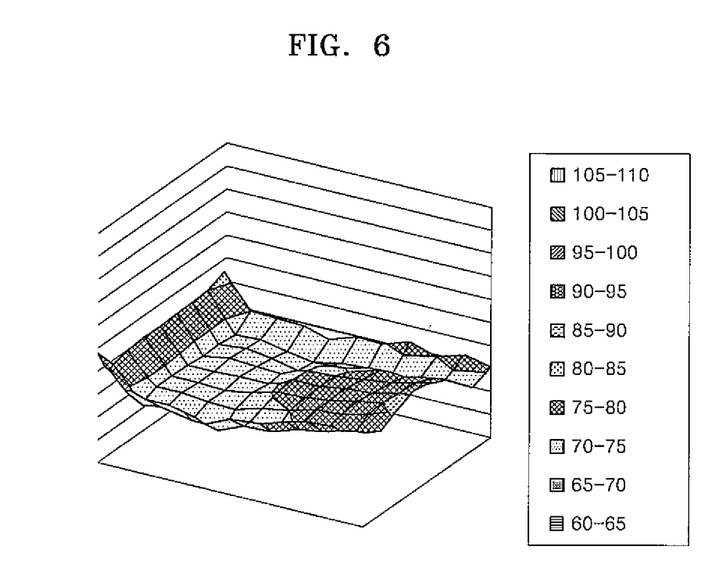

FIGS. 5 and 6 are schematic views illustrating results from the method of determining whether or not the susceptor is normal, from which it may be determined that the susceptor is normal. FIG. 5 illustrates a result of measuring a surface resistance of an ITO film in which the substrate S formed with an ITO film is placed on (e.g., mounted on) the susceptor 20 and then about 20 minutes has passed (unit: Ωcm). It may be realized that the surface resistance is illustrated has having no large difference according to a position on a surface of the ITO film. FIG. 6 three-dimensionally illustrates the surface resistance according to the position on the surface of the ITO film, in which although the surface resistance is relatively low at a central portion of the ITO film and is relatively a little high at an edge thereof, it may be realized that a relative difference therebetween is not large (unit: Ωcm). This means that the difference between the temperature at the central portion of the susceptor 20 and the temperature at the edge of the susceptor 20 is not large. Actually, FIGS. 5 and 6 illustrate a case in which the deviation of the surface resistance of the ITO layer is 9.28% and the susceptor 20 is normal or not defective.

The surface resistance of the annealed transparent conductive layer on the susceptor 20 may be measured by, for example, using a surface resistor disposed in the chamber 10 or the substrate having the annealed transparent conductive layer on the susceptor 20 may be removed from the chamber 10 and the surface resistance of the transparent conductive layer may be measured by using another surface resistor. While measuring the surface resistance, it may be understood that the surface resistance may be measured in a plurality of locations on the transparent conductive layer.

As described above, because the method of determining whether or not the susceptor of the CVD apparatus is normal, according to the present embodiment, is performed while a CVD apparatus is in a deposition configuration, for example, without separating the upper chamber 11 and the lower chamber 13 from each other, and a temperature and a vacuum atmosphere (e.g., a vacuum state) for performing deposition in the CVD apparatus are maintained, it may be effectively and quickly determined whether or not the susceptor 20 is normal.

On the other hand, as described above, because the surface resistance of the transparent conductive layer is measured and it is determined from a result thereof whether or not the susceptor 20 is normal, when an abnormality is present in the transparent conductive layer before annealing the transparent conductive layer, it may not be accurately or correctly determined whether or not the susceptor 20 is normal. Accordingly, when a substrate formed with an amorphous transparent conductive layer is prepared, it may be determined whether or not a surface resistance of the amorphous transparent conductive layer is normal, and when the surface resistance is normal, the substrate may be inserted into the chamber 10. In this case, determining whether or not the surface resistance of the amorphous transparent conductive layer is normal may be understood to include determining whether or not the surface resistance is substantially uniform across the entire surface of the amorphous transparent conductive layer.

The method of determining whether or not the susceptor of the CVD apparatus is normal has been described above according to one or more example embodiments of the present invention. However, the example embodiments are not limited thereto. For example, a method of manufacturing an organic light emitting display apparatus using the method of determining whether or not the susceptor of the CVD apparatus is normal may also be included in one or more embodiments of the present invention.

While manufacturing the organic light emitting display apparatus, a hole injection layer (HIL), a hole transport layer (HTL), an emission layer (EML), an electron transport layer (ETL), and/or an electron injection layer (EIL) may be formed using a CVD apparatus. Accordingly, after forming one of more layers as described above on a substrate but before forming one or more layers on an other substrate, a substrate formed with an amorphous transparent conductive layer may be inserted into the CVD apparatus, placed on the susceptor 20, left for about 20 minutes to allow the amorphous transparent conductive layer to be annealed, and then removed (e.g., discharged) from the chamber 10 and a surface resistance thereof may be measured, thereby determining whether or not the susceptor 20 of the CVD apparatus is normal.

For example, when one hundred substrates are to be sequentially inserted into the CVD apparatus and deposition is performed, after deposition is performed on a 50th substrate among them but before a 51st substrate is inserted, a substrate formed with a transparent conductive layer may be inserted into the CVD apparatus to determine whether or not the susceptor 20 of the CVD apparatus is normal and then the 51st substrate may be allowed to be inserted sequentially (if the susceptor 20 of the CVD apparatus is determined to be normal). As described above, allowing a plurality of substrates to be sequentially inserted into the CVD apparatus and not suspending operation of the CVD apparatus while a surface resistance of the substrate formed with the transparent conductive layer, inserted midway through a production run, is being measured, allows periodic and efficient determination of whether or not an abnormality has occurred in the CVD apparatus. When the surface resistance of the substrate formed with the transparent conductive layer is measured and the abnormality is detected in the CVD apparatus, the operation of the CVD may be suspended to be maintained and/or repaired.

A process of determining whether or not the susceptor is normal in the method of manufacturing the organic light emitting display apparatus as described above is substantially similar to the method of determining whether or not the susceptor of the CVD apparatus is normal according to the embodiments described above.

Figure 7:
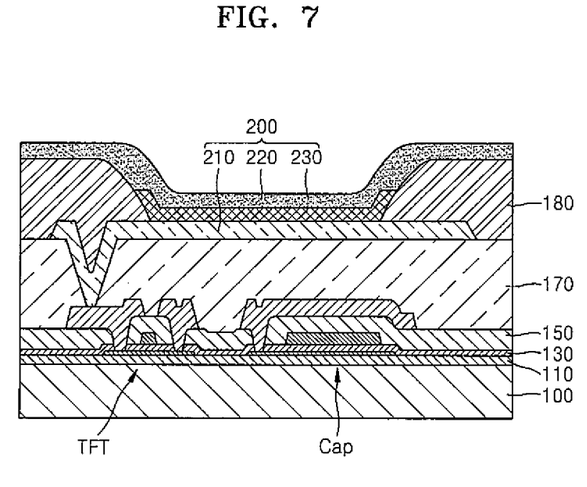
FIG. 7 is a cross-sectional view illustrating a sub-pixel of an organic light emitting display apparatus manufactured according to a method of manufacturing an organic light emitting display apparatus according to another embodiment of the present invention.

FIG. 7 is a cross-sectional view schematically illustrating a sub-pixel of an organic light emitting display apparatus manufactured using the method of manufacturing the organic light emitting display apparatus as described above. As shown in FIG. 7, a thin film transistor (TFT) and/or a capacitor is formed on a substrate 100 formed of, for example, glass or a plastic material and one or more pixel electrodes 210 are electrically connected thereto, and an opposite electrode 220 formed as a single body, corresponding to pixel electrodes 210, and intermediate layer 230 disposed between the pixel electrodes 210 and the opposite electrode 220 and including an emission layer are formed thereon. In this case, a buffer layer 110, a gate insulating layer 130, an interlayer insulating layer 150, a planarization layer 170, and/or a pixel-definition layer 180 may be formed.

In manufacturing the organic light emitting display apparatus, when forming at least one layer of the intermediate layer 230 of an organic light emitting device (OLED) 200 or other layers such as the buffer layer 110, the CVD apparatus as described herein may be used. Accordingly, between forming the layers of the intermediate layer 230 or between forming the intermediate layer 230 and forming another intermediate layer 230, a substrate having an amorphous transparent conductive layer may be inserted into the CVD apparatus, the amorphous transparent conductive layer may be annealed, and it may be determined whether or not the susceptor 20 is normal by measuring a surface resistance thereof, thereby forming various layers having substantially uniform thicknesses.

As described above, according to the one or more of the above example embodiments of the present invention, there is provided a method for testing a susceptor of a CVD apparatus capable of determining whether or not the susceptor is normal without reducing a temperature of a chamber of the CVD apparatus and a method of manufacturing an organic light emitting display apparatus using the method for testing the susceptor of the CVD apparatus.

It should be understood that the example embodiments described herein should be considered in a descriptive sense only and not for purposes of limitation. Descriptions of features and/or aspects within each embodiment should typically be considered as available for other similar features and/or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A method for testing a susceptor of a chemical vapor deposition (CVD) apparatus, the method comprising:
    preparing a substrate comprising a transparent conductive layer;
    disposing the substrate with the transparent conductive layer on the susceptor of the CVD apparatus and annealing the transparent conductive layer; and
    determining a temperature of the susceptor of the CVD apparatus by measuring a surface resistance across the annealed transparent conductive layer.

2. The method of claim 1, wherein the measuring the surface resistance across the annealed transparent conductive layer comprises determining uniformity of the surface resistance across the annealed transparent conductive layer.

3. The method of claim 2, wherein the susceptor is suitable for deposition when a deviation of the surface resistance across the annealed transparent conductive layer is about 15% or less.

4. The method of claim 1, wherein the measuring the surface resistance across the annealed transparent conductive layer comprises measuring the surface resistance across a plurality of locations on the annealed transparent conductive layer.

5. The method of claim 1, wherein the transparent conductive layer comprises an amorphous transparent conductive layer.

6. The method of claim 1, wherein the disposing the substrate with the transparent conductive layer is performed while the CVD apparatus has a temperature and a vacuum level for performing deposition.

7. The method of claim 1, wherein the transparent conductive layer comprises at least one of indium tin oxide, zinc oxide, and aluminum zinc oxide.

8. A method for manufacturing an organic light emitting display apparatus, the method comprising:
preparing a substrate comprising a transparent conductive layer;
disposing the substrate with the transparent conductive layer on a susceptor of a chemical vapor deposition (CVD) apparatus and annealing the transparent conductive layer;
determining a temperature of the susceptor of the CVD apparatus by measuring a surface resistance across the annealed transparent conductive layer;
removing the substrate with the annealed transparent conductive layer from the CVD apparatus;
inserting an other substrate into the CVD apparatus when the temperature of the susceptor is maintained at a suitable temperature for the deposition; and
performing deposition on the other substrate to form a deposition film.

9. The method of claim 8, wherein the measuring the surface resistance across the annealed transparent conductive layer further comprises measuring uniformity of the surface resistance across the annealed transparent conductive layer.

10. The method of claim 9, wherein the temperature of the susceptor is suitable for the deposition when a deviation of the surface resistance across the annealed transparent conductive layer is about 15% or less.

11. The method of claim 8, wherein the measuring a surface resistance across the annealed transparent conductive layer comprises measuring the surface resistance across a plurality of locations on the annealed transparent conductive layer.

12. The method of claim 8, wherein the transparent conductive layer comprises an amorphous transparent conductive layer.

13. The method of claim 8, wherein the disposing the substrate with the transparent conductive layer is performed in the CVD apparatus having a temperature and a vacuum level for performing the deposition.

14. The method of claim 8, wherein the transparent conductive layer comprises at least one of indium tin oxide, zinc oxide, and aluminum zinc oxide.

* * * * *